(12) United States Patent
Huang

(10) Patent No.: US 8,601,345 B1
(45) Date of Patent: Dec. 3, 2013

(54) METHOD AND APPARATUS FOR SEARCHING FRAME ALIGNMENT WITH FALSE ALIGNMENT PROTECTION

(75) Inventor: Shuo Huang, Novato, CA (US)

(73) Assignee: Tellabs Operations, Inc., Naperville, IL (US)

( * ) Notice: Subject to any disclaimer, the term of this patent is extended or adjusted under 35 U.S.C. 154(b) by 848 days.

(21) Appl. No.: 12/778,398

(22) Filed: May 12, 2010

(51) Int. Cl.
*H03M 13/00* (2006.01)
*H04J 3/06* (2006.01)

(52) U.S. Cl.
USPC .......................................... 714/758; 370/509

(58) Field of Classification Search
None
See application file for complete search history.

(56) References Cited

U.S. PATENT DOCUMENTS

| | | | | |
|---|---|---|---|---|
| 4,943,958 A | * | 7/1990 | Young et al. | 370/466 |
| RE33,900 E | * | 4/1992 | Howson | 370/514 |
| 5,193,087 A | * | 3/1993 | Lichtash et al. | 370/360 |
| 5,453,989 A | * | 9/1995 | Kitayama et al. | 370/241 |
| 5,506,956 A | * | 4/1996 | Cohen | 714/6.1 |
| 5,570,370 A | * | 10/1996 | Lin | 370/347 |
| 5,577,196 A | * | 11/1996 | Peer | 714/4.1 |
| 5,608,734 A | * | 3/1997 | Sandler et al. | 370/509 |
| 5,621,773 A | | 4/1997 | Varma et al. | |
| 5,842,007 A | * | 11/1998 | Tarsky et al. | 712/225 |
| 6,963,627 B1 | * | 11/2005 | Radi | 375/372 |
| 2002/0122435 A1 | * | 9/2002 | Mundkur et al. | 370/503 |
| 2012/0082260 A1 | * | 4/2012 | Lee et al. | 375/295 |

OTHER PUBLICATIONS

CCITT: Article regarding Frame Alignment and Cyclic Redundancy Check (CRC) Procedures Relating to Basic Frame Structures Defined in Recommendation G.704, dated Geneva, 1991, 18 pages.
ITU-T: Article regarding Synchronous Frame Structures used at 1544, 6312, 2048, 8448 and 44 736 kbit/s Hierarchical Levels G.704 (dated Oct. 98), 45 pages.

* cited by examiner

*Primary Examiner* — Guerrier Merant
(74) *Attorney, Agent, or Firm* — James M. Wu; JW Law Group

(57) ABSTRACT

A method and apparatus for enhancing frame alignment using cyclic redundancy check ("CRC") corrections are disclosed. In one embodiment, a process of frame alignment searches a predefined bit pattern within a first multi-frame structure and provides an assumed frame boundary after identifying the predefined bit pattern in the first multi-frame structure. While calculating a CRC value in response to the assumed frame boundary, the process further corrects the CRC value in accordance with a saved residue and F-bits identified by the assumed frame boundary. The assumed frame boundary is subsequently verified by comparing the calculated CRC value with embedded CRC value obtained from a second multi-frame structure.

17 Claims, 16 Drawing Sheets

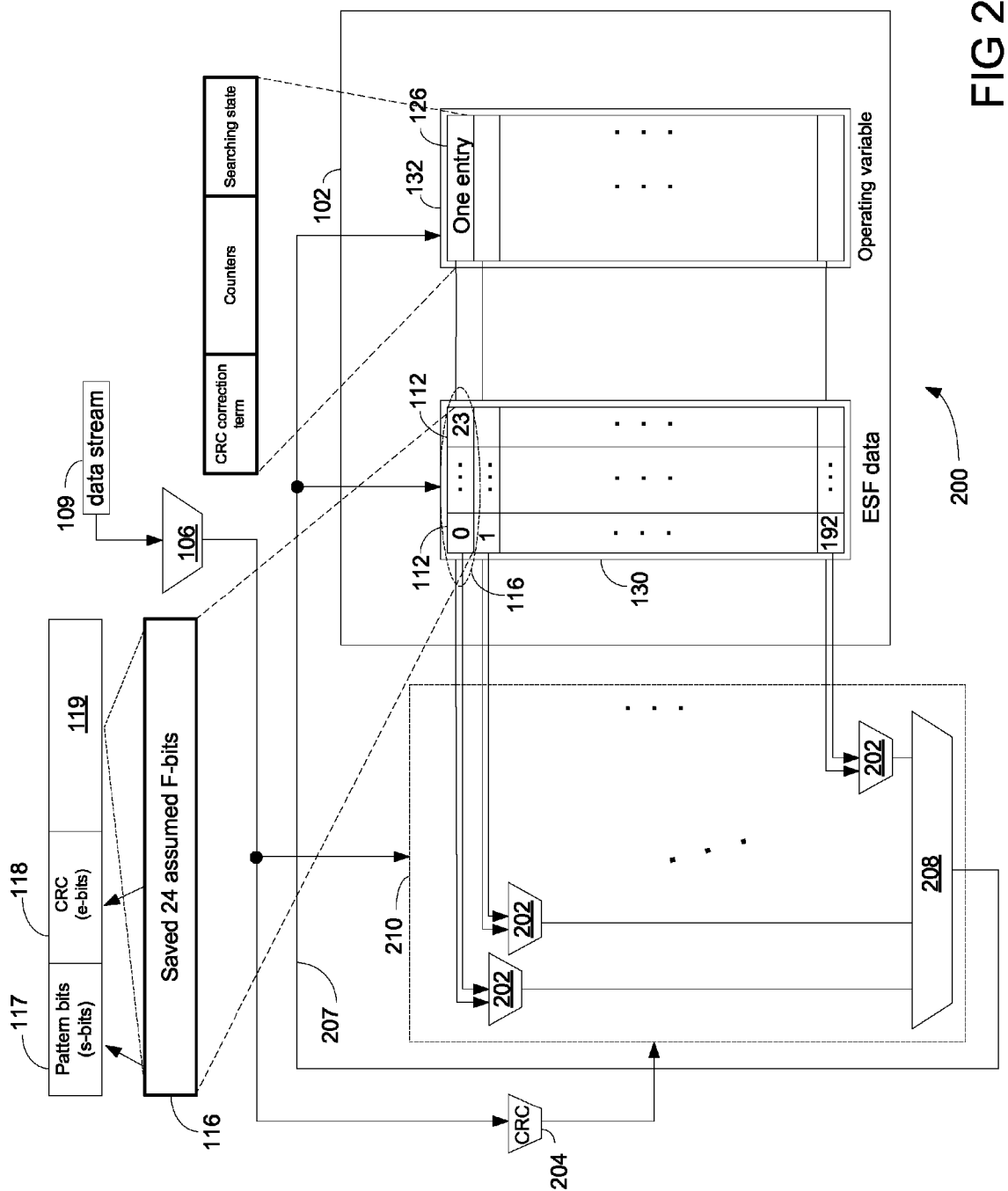

```
Done <= 0;
Init <= 1;
crc[5:0] <= "00000";
while(done==0) {
    for(bcnt=0; bcnt<193 and done==0; bcnt=bcnt+1) {
        for(ocnt=0; ocnt<4 and done==0; ocnt=ocnt+1) {
            din <= received one bit from stream;
            sr[23:0] <= memory_sr_field[bcnt];
            state[1:0] <= memory_state[ocnt]_field[bcnt];
            qcnt[4:0] <= memory_qcnt[ocnt]_field[bcnt];
            cor[5:0] <= memory_cor[ocnt]_field[bcnt];
            if(init=1) {
                qcnt <= 0;
                state <= 0;               // state 0 = idle
            }
            if(init==0 && state==0 && sr[20]==0 && sr[16]==0 &&
               sr[12]==1 && sr[8]==0 && sr[4]==1 && sr[0]==1 &&
               qcnt>=5) {
                state <= 1;     // state 1 = found pattern
                cor[0] <= crc[0];   // residue = current global CRC
                cor[1] <= crc[1];
                cor[2] <= crc[2];
                cor[3] <= crc[3];
                cor[4] <= crc[4];
                cor[5] <= crc[5];
                qcnt <= 0;
            }
```

```
else if(init==0 && state==1 && sr[20]==0 && sr[16]==0 && sr[12]==1
&& sr[8]==0 && sr[4]==1 && sr[0]==1 && qcnt==5) {
    state <= 2;         // state 2 = got CRC
    cor[0] <= crc[0]⊕ cor[2]⊕ cor[5]⊕ !sr[23]⊕ !sr[21]⊕ !sr[20]⊕
    !sr[21]⊕ !sr[20]⊕ !sr[19]⊕ !sr[18]⊕ !sr[15]⊕ !sr[13]⊕
    !sr[9]⊕ !sr[8]⊕ !sr[3];// cor now is CRC
    cor[1] <= crc[1]⊕ cor[0]⊕ cor[2]⊕ cor[3]⊕ cor[5]⊕ !sr[23]⊕
    !sr[21]⊕ !sr[20]⊕ !sr[18]⊕ !sr[15]⊕ !sr[12]⊕ !sr[11]⊕
    !sr[10]⊕ !sr[6]⊕ !sr[4]⊕ !sr[3]⊕ !sr[2]⊕ !sr[1];
    cor[2] <= crc[2]⊕ cor[1]⊕ cor[3]⊕ cor[4]⊕ !sr[22]⊕ !sr[20]⊕
    !sr[19]⊕ !sr[18]⊕ !sr[17]⊕ !sr[14]⊕ !sr[12]⊕ !sr[8]⊕
    !sr[7]⊕ !sr[2];
    cor[3] <= crc[3]⊕ cor[2]⊕ cor[4]⊕ cor[5]⊕ !sr[23]⊕ !sr[18]⊕
    !sr[12]⊕ !sr[11]⊕ !sr[10]⊕ !sr[9]⊕ !sr[8]⊕ !sr[7]⊕
    !sr[5]⊕ !sr[3]⊕ !sr[1]⊕ !sr[0];
    cor[4] <= crc[4]⊕ cor[0]⊕ cor[3]⊕ cor[5]⊕ !sr[23]⊕ !sr[21]⊕
    !sr[19]⊕ !sr[17]⊕ !sr[16]⊕ !sr[13]⊕ !sr[12]⊕ !sr[10]⊕
    !sr[9]⊕ !sr[8]⊕ !sr[6]⊕ !sr[5]⊕ !sr[3]⊕ !sr[0];
    cor[5] <= crc[5]⊕ cor[1]⊕ cor[4]⊕ !sr[22]⊕ !sr[21]⊕ !sr[19]⊕
    !sr[16]⊕ !sr[13]⊕ !sr[12]⊕ !sr[11]⊕ !sr[7]⊕ !sr[5]⊕
    !sr[4]⊕ !sr[3]⊕ !sr[2];
    qcnt <= 0;
}
```

```
        else if(init==0 && state==2 && sr[20]==0 && sr[16]==0 && sr[12]==1
        && sr[8]==0 && sr[4]==1 && sr[0]==1 && qcnt==5) {
          if(sr[22]==cor[5] && sr[18]==cor[4] && sr[14]==cor[3] &&
             sr[10]==cor[2] && sr[6]==cor[1] && sr[2]==cor[0])
             done <= 1;             // CRC passed, search done
          else state <= 0;
        }
        else if(qcnt==5) {
          state <= 0;
          qcnt <= 0;
        }
        else qcnt <= qcnt+1;
        sr[23:1] <= sr[22:0];
        sr[0] <= din;
        crc[0] <= crc[5]⊕ din;          // Calculate global CRC
        crc[1] <= crc[5]⊕ crc[0]⊕ din;
        crc[2] <= crc[1];
        crc[3] <= crc[2];
        crc[4] <= crc[3];
        crc[5] <= crc[4];
        memory_sr_field[ocnt]_field[bcnt] <= sr[23:0];
        memory_state[ocnt]_field[bcnt] <= state[1:0];
        memory_qcnt[ocnt]_field[bcnt] <= qcnt[4:0];
        memory_cor[ocnt]_field[bcnt] <= cor[5:0];
        if(init==1 && bcnt==192 && ocnt==3)
          init <= 0;
      }     // end of for ocnt
    }       // end of for bcnt
  }         // end of while
}
```

```
done <= 0;
init <= 1;
crc[5:0] <= "000000";
fcnt[4:0] <= 0;
while(done==0) {
    for(bcnt=0; bcnt<193 and done==0; bcnt=bcnt+1) {
        for(ocnt=0; ocnt<4 and done==0; ocnt=ocnt+1) {
            din <= received one bit from stream;
            sr[23:0] <= memory_sr_field[bcnt]; // retrieve regs from memory
            state <= memory_state[ocnt]_field[bcnt];
            qcnt[2:0] <= memory_qcnt[ocnt]_field[bcnt];
            if(init==1) cor[5:0] <= 0;
            else cor[5:0] <= memory_cor[fcnt]_field[bcnt];
            if(init==1) {                // overwrite registers if in initial state
                qcnt <= 0;
                state <= 0;              // state 0 = idle
            }
```

```
else if(init==0 && state==0 && sr[20]==0 && sr[16]==0 && sr[12]==1
    && sr[8]==0 && sr[4]==1 && sr[0]==1 && qcnt>=5) {
    state <= 1;      // state 1 = found pattern & CRC
    cor[0] <= crc[0]⊕ cor[2]⊕ cor[5]⊕ !sr[23]⊕ !sr[21]⊕ !sr[20]⊕
        !sr[21]⊕ !sr[20]⊕ !sr[19]⊕ !sr[18]⊕ !sr[15]⊕ !sr[13]⊕
        !sr[9]⊕ !sr[8]⊕ !sr[3];// cor now is CRC
    cor[1] <= crc[1]⊕ cor[0]⊕ cor[2]⊕ cor[3]⊕ cor[5]⊕ !sr[23]⊕
        !sr[21]⊕ !sr[20]⊕ !sr[18]⊕ !sr[15]⊕ !sr[12]⊕ !sr[11]⊕
        !sr[10]⊕ !sr[6]⊕ !sr[4]⊕ !sr[3]⊕ !sr[2]⊕ !sr[1];
    cor[2] <= crc[2]⊕ cor[1]⊕ cor[3]⊕ cor[4]⊕ !sr[22]⊕ !sr[20]⊕
        !sr[19]⊕ !sr[18]⊕ !sr[17]⊕ !sr[14]⊕ !sr[12]⊕ !sr[8]⊕
        !sr[7]⊕ !sr[2];
    cor[3] <= crc[3]⊕ cor[2]⊕ cor[4]⊕ cor[5]⊕ !sr[23]⊕ !sr[18]⊕
        !sr[12]⊕ !sr[11]⊕ !sr[10]⊕ !sr[9]⊕ !sr[8]⊕ !sr[7]⊕
        !sr[5]⊕ !sr[3]⊕ !sr[1]⊕ !sr[0];
    cor[4] <= crc[4]⊕ cor[0]⊕ cor[3]⊕ cor[5]⊕ !sr[23]⊕ !sr[21]⊕
        !sr[19]⊕ !sr[17]⊕ !sr[16]⊕ !sr[13]⊕ !sr[12]⊕ !sr[10]⊕
        !sr[9]⊕ !sr[8]⊕ !sr[6]⊕ !sr[5]⊕ !sr[3]⊕ !sr[0];
    cor[5] <= crc[5]⊕ cor[1]⊕ cor[4]⊕ !sr[22]⊕ !sr[21]⊕ !sr[19]⊕
        !sr[16]⊕ !sr[13]⊕ !sr[12]⊕ !sr[11]⊕ !sr[7]⊕ !sr[5]⊕
        !sr[4]⊕ !sr[3]⊕ !sr[2];
    qcnt <= 0;
}
```

FIG.6C

```
else if(init==0 && state==1 && sr[20]==0 && sr[16]==0
    && sr[12]==1 && sr[8]==0 && sr[4]==1 && sr[0]==1
    && fcnt==23) {
    if(sr[22]==cor[5] && sr[18]==cor[4] &&
       sr[14]==cor[3] && sr[10]==cor[2] &&
       sr[6]==cor[1] && sr[2]==cor[0])
       done <= 1;        // CRC passed, search done
    state <= 0;
    }
else if(qcnt==5) {
    state <= 0;
    qcnt <= 0;
    }
else qcnt <= qcnt + 1;
```

560 { (first block)
562 { (second block)

FIG.6D

```
if(state==0 && qcnt<6) {          // residue=current global CRC
    cor[0] <= crc[0];
    cor[1] <= crc[1];
    cor[2] <= crc[2];
    cor[3] <= crc[3];
    cor[4] <= crc[4];
    cor[5] <= crc[5];
}
sr[23:1] <= sr[22:0];             // Update shift register
sr[0]   <= din;
crc[0] <= crc[5]    din;          // Calculate global CRC
crc[1] <= crc[5]    crc[0]   din;
crc[2] <= crc[1];
crc[3] <= crc[2];
crc[4] <= crc[3];
crc[5] <= crc[4];
memory_sr_field[bcnt] <= sr[23:0];  // Save regs to memory
memory_state[ocnt]_field[bcnt] <= state[1:0];
memory_qcnt[ocnt]_field[bcnt] <= fcnt[4:0];
memory_cor[fcnt]_field[bcnt] <= cor[5:0];
if(fcnt==23) fcnt <= 0;
else fcnt <= fcnt+1;
if(init==1 && bcnt==192 && ocnt==3)
    init <= 0;
}       // end of for(ocnt)
}       // end of for(bcnt)
}       // end of while
}
```

METHOD AND APPARATUS FOR SEARCHING FRAME ALIGNMENT WITH FALSE ALIGNMENT PROTECTION

FIELD

The exemplary embodiment(s) of the present invention relates to a communications network. More specifically, the exemplary embodiment(s) of the present invention relates to high speed frame alignment for a communications network.

BACKGROUND

With increasing demand for more information to be supplied to homes and/or businesses, many network communication providers are switching or upgrading their networks to high speed communication signaling protocol, such as Digital Signal 1 ("DS1") or T1. High speed communication signaling protocol typically offers high speed audio, video, and data transmission to/from homes and/or businesses. For example, DS1 is capable of organizing voltage values as data signals in a serial data stream which can be transmitted over a pair of conductor wires. At the receiving end, upon recovery of clock frequencies from the data signals, a receiving circuit typically needs to identify frame and/or Extended Super Frame ("ESF") boundaries from the data stream before the information carried by DS1 can be adequately processed.

Depending on the network environment, aligning or realigning DS1 or T1 ESF can be time consuming. Information carried by the frames or ESF can not be processed until the boundary of each ESF is identified. As such, an extended delay for realigning frames or ESF can negatively impact the overall network performance.

A conventional approach to identify a boundary of a frame or an ESF, for example, is to pick one (1) bit for every 193 bits. Upon a group of bits or picked bits are collected, the group of bits is assumed to contain information relating to frame alignment. As such, when a group of bits is collected, a frame pattern is searched within the collected bits. In one example, a frame pattern can be searched from a group of bits includes 48 bits which represent two ESFs. Two ESFs typically take 6 milliseconds ("ms") to transmit over T1 or DS1. Upon recognizing the frame pattern, the process declares that the first frame pattern is found. Otherwise, the process selects a bit arrived later in time as a new frame bit which may contain information relating to frame alignment position, and proceeds to repeat the similar search(s) as previously described. This process continues until a frame pattern is located in the bit stream. With such conventional approach, the time required to identify a frame boundary could take as long as 1158 ms (193×6) to locate a first match of frame pattern. It should be noted that an alignment delay of 1158 ms may be too long for some applications. The alignment process could be even longer if the found alignment is a false alignment.

SUMMARY

A method and apparatus for improving the speed of frame alignment using simultaneous pattern search and cyclic redundancy check ("CRC") are disclosed. In one embodiment, a process of frame alignment collects assumed frame bits ("F-bits") from data stream and searches a predefined bit pattern within the assumed F-bits. The process generates an assumed multi-frame structure alignment boundary as soon as the predefined bit pattern is identified in the assumed F-bits. Upon calculating the current CRC value in response to the assumed alignment boundary, the process simultaneously calculates CRC for all 193 possible frame alignment positions. In one embodiment, one CRC or "global" CRC calculate circuit with correction technique is used to generate CRC values by tailoring or correcting the global CRC results. For example, the CRC values, which indicate specific frame alignment position, are generated in accordance with the current global CRC results, previously saved residue values and the F-bits. One assumed alignment boundary out of all possibly found boundaries is subsequently verified as a true boundary by comparing its calculated CRC value with its embedded CRC value obtained from a second multi-frame structure.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

FIG. 2 is a block diagram illustrating a network device capable of performing DS1 ESF alignment with a parallel processing mechanism in accordance with one embodiment of the present invention;

FIGS. 5A-D illustrate a method (method one) for identifying an ESF frame alignment using a CRC calculation unit in accordance with one embodiment of the present invention;

FIGS. 6A-E illustrate an alternative method (method two) for identifying an ESF frame alignment with false alignment protection in accordance with one embodiment of the present invention;

DETAILED DESCRIPTION

Exemplary embodiment(s) of the present invention is described herein in the context of a method, system and apparatus of improving the frame alignment for a communications network.

Those of ordinary skills in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skills in the art having the benefit of this disclosure.

Embodiments of the present invention illustrate an apparatus or a method capable of quickly aligning frames or extended super frame ("ESF") from a data stream using parallel searching and parallel cyclic redundancy check ("CRC") generation with residue and F-bit corrections. The process, in one embodiment, searches a predefined bit pattern and provides an assumed alignment or ESF boundary upon identifying the frame alignment signal (or bit pattern) in the collected assumed F-bits. Upon calculating a global CRC value which is shared by all the assumed alignment boundaries, the process tailors a global calculated CRC value in accordance with a previously saved residue value and F-bits in response to one assumed alignment boundary. An assumed alignment boundary is subsequently verified as a true frame boundary by comparing the CRC value calculated from the data stream (with assumed frame boundary) with an embedded CRC value obtained from the next multi-frame structure.

Figure 1:
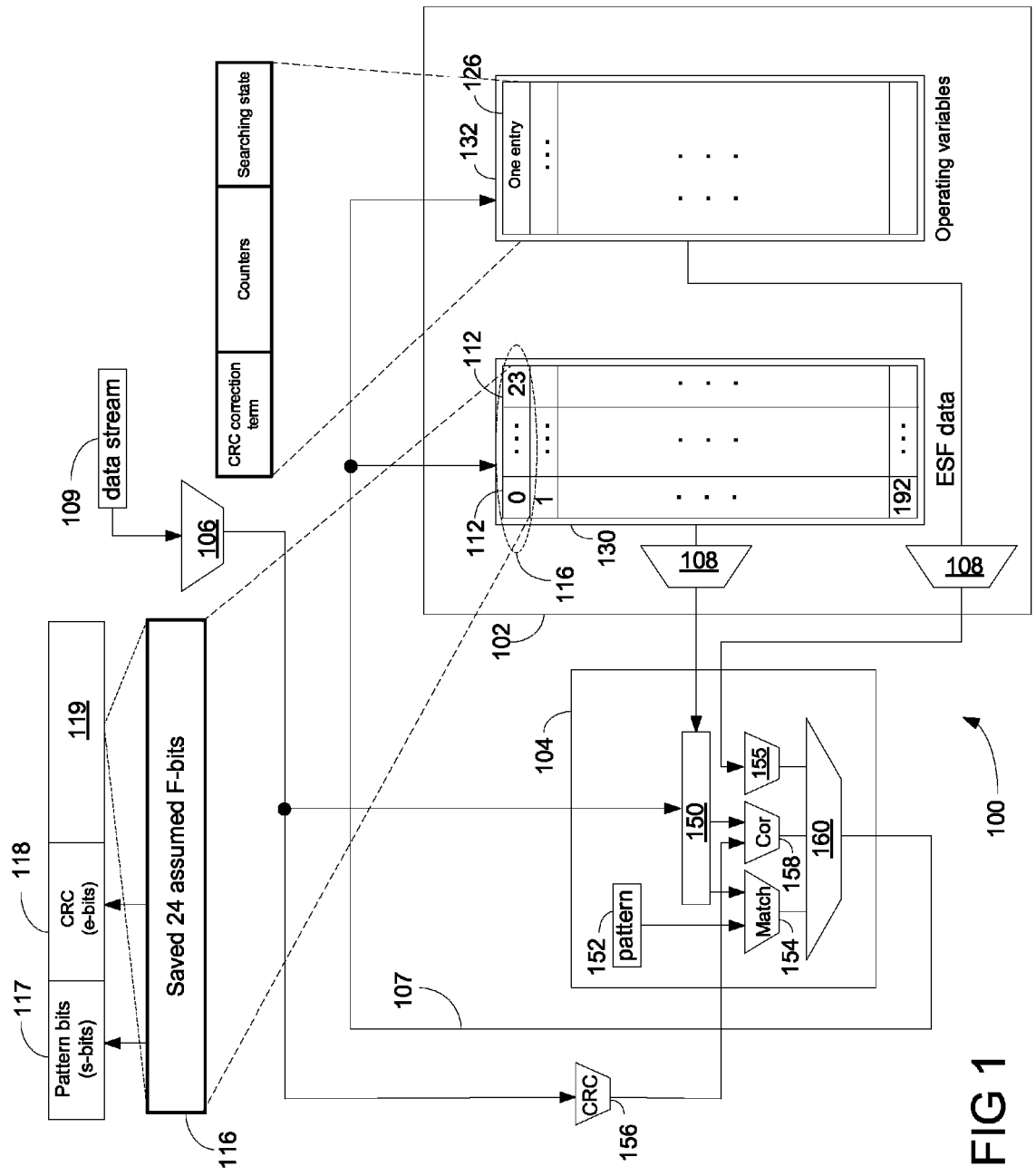
FIG. 1 is a block diagram illustrating a network device capable of performing Digital Signal 1 ("DS1") or T1 Extended Super Frame ("ESF") alignment with false alignment protection in accordance with one embodiment of the present invention.

FIG. 1 is a block diagram illustrating a network device 100 capable of performing Digital Signal 1 ("DS1") or T1 Extended Super Frame ("ESF") alignment with false alignment protection in accordance with one embodiment of the present invention. Device 100 includes a memory 102, a frame alignment unit 104, a global CRC calculator 156, and a data stream 109. Memory 102, in one embodiment, is divided into ESF data storage section 130 and operating variable section 132. The multi-frame structure or ESF is an enlarged frame structure capable of carrying more information than regular frames. It should be noted that the underlying concept of the embodiment does not change if one or more functional elements were added to or removed from device 100. Depending on the type of communication protocol used, the size of a multi-frame structure may vary based on the number of bits per each frame and the number of frames per each structure. The embodiments of present invention are applicable to any type of serial communication protocols using frames or multi-frame structures. To simplify the foregoing description, however, DS1 framing structure will be used as an exemplary communication protocol to illustrate various features of the embodiments of the present invention.

DS1, also known as T1, is a serial communication protocol using frames and ESF to carry or transport information between network devices via a communications network. Each DS1 frame includes 193 bits and the duration for each frame takes 125 micro seconds ("µs"). The first bit of each frame is designated as a framing bit or F-bit. Twenty-four (24) DS1 frames form an ESF wherein the duration for each ESF lasts 3 milliseconds ("ms"). Each ESF includes twenty-four (24) framing bits or F-bits wherein six (6) F-bits are used for frame synchronization (also known as bit pattern or frame pattern or frame alignment signals) while another group of six (6) F-bits are used for CRC. These six (6) F-bits for CRC are the CRC result calculated from data bits of the previous ESF. The remaining twelve (12) F-bits are dedicated to administrative data link (DL) channel. The six frame alignment F-bits are herein referred to as s-bits, and the six CRC bits are referred to as e-bits in this document.

Memory 102, in one embodiment, includes an outputting element 108, an ESF data section 130, and operating variable section 132. ESF data section 130 stores data bits of 24 frames wherein each frame 112 contains 193 bits of information. During an initial operation, alignment unit 104, for example, can not process the received information before a true frame boundary is identified. To identify the frame boundary or frame alignment, an arbitrary frame alignment position, also known as bit position is selected. For instance, one arbitrary bit is selected as a starting bit of an assumed frame. Note that there are a total of 193 possible bit positions.

In one embodiment, each assumed frame is logically organized in a column thereby the F-bit of the assumed frame can be situated on the top row 116 of ESF data block 130. One row of the ESF data block 130 includes 24 saved assumed F-bits 116, which may be grouped or selected to form assumed framing synchronization 117, CRC 118, and DL channel 119. Framing synchronization 117, in one example, is expected to have a predefined bit pattern such as 001011 as frame alignment signal(s). The bit locations in 24 assumed F-bits 116 for the frame alignment signal (s-bits), for instance, are situated at 4, 8, 12, 16, 20, and 24 which correspond to assumed ESF bit locations 580, 1352, 2124, 2896, 3668, and 4440, respectively.

During an operation, shift register 150 is pre-loaded with previously saved F-bits from a row in ESF data section 130 of memory 102. In the mean time, operating variables such as counters and searching state, are loaded to corresponding registers from section 132 of memory 102. Upon receipt of a data bit from data stream 109, it is shifted into shift register 150, while the oldest or the most significant bit in shift register 150 is shifted out and then discarded. The value of the shift register, together with updated operating variables in registers, is written back to the memory at an address associated with the specific bit position. In one aspect, data bits are logically stored in a column from top to bottom and shifted from right to left when data bits of next frame are received. By using this storing scheme, the assumed F-bits of one bit position can be located on, for example, the top row. Note that F-bits of other 192 bit positions can be located on other rows from the same memory structure. Depending on applications, memory 102 may be reconfigured to store data structures other than DS1 ESF data structures.

Frame alignment unit 104, in one embodiment, includes shift register 150, a matching element 154, a CRC correction unit 158, a counter and state update unit 155, and an output multiplexer 160. Frame alignment unit 104, in one embodiment, indicates a functional unit for searching frame alignment of one bit position, and to verify the found alignment using CRC. In order to search frame alignment of all 193 bit positions, multiple units of frame alignment unit 104 may be used. In an alternative approach, the multiple units of frame alignment unit 104 can be implemented by a single unit that runs at a faster clock speed. The single unit, in other words, are shared with all 193 bit positions.

After each operating step, the intermediate variables in registers, such as CRC residue, counters and state, are saved in operating variable section 132 of memory 102. When it is time to continue at the next searching step, the intermediate variables for a particular bit position are retrieved from operating variable section 132 of memory 102 to the registers.

Operating variable section 132 and the data section 310 can be implemented in the same physical memory device. It should be noted that the components 154-160 depicted in frame alignment unit 104, as well as the global CRC calculator 156, may be built from digital circuit, or may be merged or combined into one or more processing controllers or DSPs to perform similar or the same functions. Matching element 154 subsequently obtains a predefined bit pattern 152 and compares the predefined bit pattern 152 such as 001011 with assumed frame synchronous bits (s-bits) obtained from shift register 150.

Upon identifying a match between predefined bit pattern 152 and the frame synchronous bits extracted from shift register 150, an ESF boundary is identified. To verify the found ESF boundary as a true ESF alignment, not only the bit pattern repeats in the proceeding ESFs, a CRC check is also performed. A false match between predefined bit pattern 152 and the frame synchronous bits is possible if the data happens to contain a bit pattern similar to predefined bit pattern 152. To prevent false match, the CRC check is implemented.

The CRC check, in one embodiment, involves a comparison between the CRC value calculated from all the data bits in current ESF and the CRC value embedded in the F-bits of the next ESF. To remove or prevent a false alignment, a CRC value is calculated in accordance with all 4632 bits in current ESF.

Figure 3A:
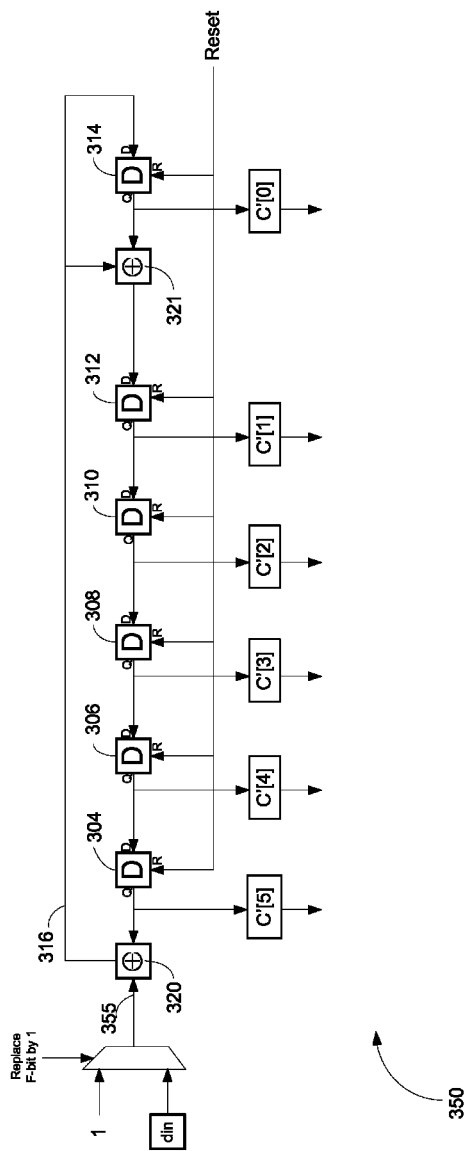
FIGS. 3A-B illustrate a process of generating a CRC value using a global CRC calculation value, a saved residue value and F-bits in accordance with one embodiment of the present invention.

Conventionally, a circuit in FIG. 3A is used to calculate CRC. To obtain a correct CRC value, the CRC calculation registers 350 as shown in FIG. 3A need to be cleared via R inputs of registers and the F-bits in the ESF need to be forced to logic "1" state before entering the circuit at 355. Result of CRC can be collected at ports C'[0] to C'[5] of 301 of FIG. 3A at the end of an ESF. Resetting or clearing CRC calculation registers and forcing F-bits to logic "1" states can be difficult and/or slow down the computation of CRC values of all 193 assumed frame alignments. To avoid resetting CRC registers and forcing F-bit(s) for CRC calculation for every bit position, embodiment(s) of the present invention provides a method using global CRC calculator 156, which uses circuit 301 shown in FIG. 3B without initial resetting or F-bits forcing, and a correction unit 158 to correct or adjust global CRC results to obtain correct CRC result for every bit position.

In one embodiment, one global CRC element is employed to continuously perform calculations on the data stream. For each bit position, the value of the global CRC calculation is memorized at the start of the assumed ESF, which is called the residue. At the end of that assumed ESF, the value of the global CRC calculation is then tailored using the saved residue and F-bits to the correct CRC result for this specific bit position. In FIG. 1, CRC correction module 158 is the functional unit to tailor the global CRC value to the CRC of wanted bit position. Note that frame alignment unit 104 can be shared by all 193 bit positions. CRC element 156 is the global CRC calculation unit. CRC correction element 158, like element 150, 154, and 160, can be repeatedly used for 193 bit positions at a faster speed.

Correction module 158, in one embodiment, uses residues or residue values and 24 F-bits in shift register 150 to correct CRC values. Since the global CRC value is not calculated with reset in the global CRC calculation, the result of CRC needs to be corrected in accordance with the residue. Also, because the F-bits are not forced to logic state "1" state when calculating the global CRC, the result of the global CRC value needs to be compensated in response to the original values of the F-bits. It should be also noted that CRC calculation may be performed at the same state or cycle as the frame synchronous matching state as long as the residue of corresponding assumed ESF alignment is available.

If the collected F-bits fail to match with predefined bit pattern 152, output multiplexer 160 stores back the collected F-bits to memory 102 via a connection 107. Register 150 subsequently fetches the next row in 130 as the collected F-bits of the next assumed frame bit position via outputting element 108. The process continues for all 193 bit positions. When a match is identified, the searching state of that bit position is changed. The search does not stop until a found ESF alignment is verified by persistent frame pattern matches and correct CRC.

To verify the assumed ESF boundary as a true alignment and to remove the false alignment, a CRC check is performed. In one embodiment, the CRC check involves in comparing between the calculated CRC value and an embedded CRC value extracted from the next ESF. Note that a CRC check requires data from two consecutive ESFs. In operation, upon receipt of a first DS1 ESF including 4632 bits of data, elements 156 and 158 calculate a CRC result as described earlier. The CRC result is subsequently stored in operating variable section 132 of memory 102. Note that storage bits in 132 can be shared by the CRC residue value and the CRC result. Before CRC calculation completes, the residue is in the storage, after CRC completes, the CRC result is in the storage. The result of the CRC is also known as a 6-bit CRC value or CRC-6 value. After receipt of a second DS1 ESF, six e-bits, which are embedded in the 24 framing bits, are used to compare with stored 6-bit CRC value calculated from the previous ESF. The CRC check passes if the 6-bit CRC result value and the e-bits, also known as embedded CRC value, are the same. A true ESF alignment or boundary is identified when the CRC check passes. If CRC check fails, a false alignment is identified and the searching state is changed back to the initial state for that bit position. The searches for ESF alignment of all bit positions continue.

An advantage of applying the embodiments of frame alignment using CRC corrections is to share one global CRC element with all 193 possible frame alignment bit positions. This makes parallel CRC calculation easily implementable, which makes the frame alignment completed in minimum time. Faster frame alignment provides shorter system boot-up time. Also, shorter alignment duration can improve network equipment setup time between T1 and T2 connection(s).

FIG. 2 is a block diagram illustrating a network device 200 capable of performing DS1 ESF alignment with false alignment protection using parallel processing approach in accordance with one embodiment of the present invention. Device 200 includes a memory 102, a parallel alignment unit 210, a global CRC calculator 204, and a data stream 109. Memory 102, in one embodiment, is divided into multiple storage sections 130 and 132, wherein the ESF data section is able to store bits carried by a multi-frame structure (or ESF). The operating variable section stores variables, such as counters and state, needed for the parallel alignment unit 210 to operate. The multi-frame structure or extended super frame (ESF) structure is an enlarged frame structure capable of transporting more information than a regular frame(s). It should be noted that the underlying concept of the embodiment does not change if one or more functional elements were added to or removed from device 200.

It should be noted that except parallel alignment unit 210, network device 200 illustrated in FIG. 2 is similar to network device 100 illustrated in FIG. 1. Parallel alignment unit 210, in one embodiment, includes multiple aligning processors 202 wherein outputs of aligning processors 202 are fed to an output element 208. In one embodiment, parallel alignment unit 210 includes 193 aligning processors 202 capable of processing 193 entries of assumed twenty-four (24) F-bits simultaneously. Note that the parallel aligning processor 202 is functionally equivalent to repeatedly used single alignment unit 104. Alignment searching performance should be the same. It should be noted that the total number of aligning processor 202 used within alignment unit 210 can vary depending on the requirements of an application.

Figure 3B:
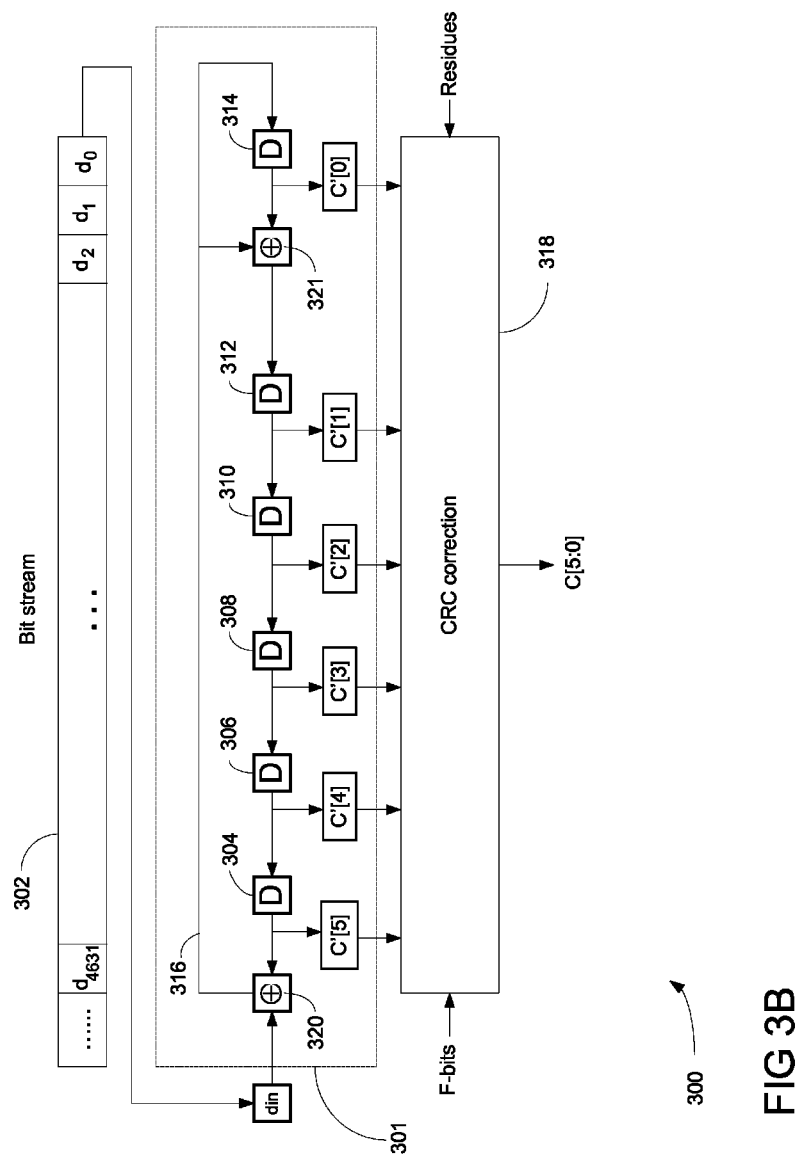

FIG. 3B is a block diagram 300 illustrating a process of generating a CRC value using residues and F-bits in accordance with one embodiment of the present invention. Diagram 300 includes continuous bit stream 302, a global CRC calculator 301, and a CRC correction unit 318 wherein global CRC calculator 301 further includes six (6) CRC registers or latches 304-314 used for CRC calculation. The outputs of CRC registers 304-314 are six (6) bits of global CRC value as indicated by port names C'[5], C'[4], C'[3], C'[2], C'[1], and C'[0]. A CRC correction is then applied to the global CRC value in the correction block 318. Saved residue bits and F-bits are used in correction procedure. The output result bits of the correction block are C[5], C[4], C[3], C[2], C[1] and C[0] (or marked as C[5:0]), also known as CRC-6 result under DS1 protocol. It should be noted that the underlying concept of the embodiment does not change if one or more functional elements were added to or removed from diagram 300.

Global CRC calculator 301, in one embodiment, includes six (6) CRC registers or latches 304-314 marked with letter "D" in the blocks and two (2) Exclusive-Or logic devices 320-322 marked with symbol "⊕" in the blocks. Global CRC calculator 301 further includes a Data Input ("din") port capable of receiving input bits from bit stream 302, and output ports C'[5:0] for outputting global CRC result bits. The global CRC results C'[5:0] generated by global CRC calculator 301 are fed to CRC correction 318 for adjusting the CRC results for a specific bit alignment position.

CRC correction 318, in one embodiment, is capable of generating CRC values C[5:0] in response to global CRC results C'[5:0], a saved residue, and F-bits. A function of CRC correction 318 is to adjust or compensate global CRC results C'[5:0] since global CRC results are calculated without resetting the CRC registers and forcing F-bits to logic "1" states. With this CRC calculating scheme, one global CRC calculator, for instance, may be used for all 193 alignment bits positions.

In one example, at the beginning of an assumed ESF, the output of the global CRC calculator is saved as residue R[5:0]. At the end of the assumed ESF, global CRC calculator 301 generates the global CRC result C'[5:0]. To obtain the final CRC value C[5:0], the global CRC result C'[5:0] is subsequently adjusted or tailored by CRC correction 318 using previously saved residue value R[5:0] and saved F-bits F[23:0]. The following formula illustrates logic implementations by CRC correction 318.

$$C[0]=C'[0] \oplus R[2] \oplus R[5] \oplus !F[23] \oplus !F[21] \oplus !F[20] \oplus !F[21] \oplus !F[20] \oplus !F[19] \oplus !F[18] \oplus !F[15] \oplus !F[13] \oplus !F[9] \oplus !F[8] \oplus !F[3];$$

$$C[1]=C'[1] \oplus R[0] \oplus R[2] \oplus R[3] \oplus R[5] \oplus !F[23] \oplus !F[21] \oplus !F[20] \oplus !F[18] \oplus !F[15] \oplus !F[12] \oplus !F[11] \oplus !F[10] \oplus !F[6] \oplus !F[4] \oplus !F[3] \oplus !F[2] \oplus !F[1];$$

$$C[2]=C'[2] \oplus R[1] \oplus R[3] \oplus R[4] \oplus !F[22] \oplus !F[20] \oplus !F[19] \oplus !F[18] \oplus !F[17] \oplus !F[14] \oplus !F[12] \oplus !F[8] \oplus !F[7] \oplus !F[2];$$

$$C[3]=C'[3] \oplus R[2] \oplus R[4] \oplus R[5] \oplus !F[23] \oplus !F[18] \oplus !F[12] \oplus !F[11] \oplus !F[10] \oplus !F[9] \oplus !F[8] \oplus !F[7] \oplus !F[5] \oplus !F[3] \oplus !F[1] \oplus !F[0];$$

$$C[4]=C'[4] \oplus R[0] \oplus R[3] \oplus R[5] \oplus !F[23] \oplus !F[21] \oplus !F[19] \oplus !F[17] \oplus !F[16] \oplus !F[13] \oplus !F[12] \oplus !F[10] \oplus !F[9] \oplus !F[8] \oplus !F[6] \oplus !F[5] \oplus !F[3] \oplus !F[0];$$

$$C[5]=C'[5] \oplus R[1] \oplus R[4] \oplus !F[22] \oplus !F[21] \oplus !F[19] \oplus !F[16] \oplus !F[13] \oplus !F[12] \oplus !F[11] \oplus !F[7] \oplus !F[5] \oplus !F[4] \oplus !F[3] \oplus !F[2];$$

Where !F[n] denotes the binary inverse value of F[n], and ⊕ denotes a binary exclusive OR operation. Note that F[23] is the first framing bit and F[0] is the last framing bit in the assumed ESF.

An advantage of using the embodiments of the present invention is to calculate CRC values via one CRC computing device. It should be noted that each F-bit as well as residue are saved or recorded with respect to the corresponding assumed ESF bit position. Upon receipt of the entire assumed ESF, a correct CRC value can be derived in response to the saved (or recorded) residue, framing bits, and the global CRC result.

The exemplary embodiment(s) of the present invention includes various processing steps, which will be described below. The steps of the embodiment(s) may be embodied in a state machine of digital circuit or computer executable instructions. The instructions can be used to cause a general purpose or special purpose system, which is programmed with the instructions, to perform the steps of the exemplary embodiment(s) of the present invention. Alternatively, the steps of the exemplary embodiment(s) of the present invention may be performed by specific hardware components that contain hard-wired logic for performing the steps, by programmable logic device such as FPGA, or by any combination of programmed computer components and custom hardware components.

The following description describes two methods, namely (a) method one and (b) method two, illustrating alternative implementations of embodiment(s) of the present invention. Both methods are, for example, capable of employing techniques of parallel pattern search and parallel CRC checking up to 193 simultaneous processing. Note that a search for an ESF alignment is completed and the boundary between ESFs is identified when the frame pattern matches and the CRC check passes. For the following description, the worst case scenario for method one takes about 12 ms or four (4) ESF durations while the best case scenario takes about 9 ms or three (3) ESF durations to identify an ESF boundary. Alternatively, the worst case scenario for method two takes about 9 ms and the best case scenario takes approximately 6 ms to determine an ESF boundary. It should be noted that both methods can be implemented by systems illustrated in FIG. 1 and/or in FIG. 2. Different methods, however, define different operating variables. The method two, for example, requires additional memory capacity (approximately 2 times more) than the method one. Different methods also have different processing units that perform different operations. Additional details relating to such processes are described in FIG. 5 and FIG. 6 and their corresponding descriptions.

Method one, method two, or a combination of method one and two can be implemented by a digital circuit, such as a FPGA, central processing unit ("CPU"), or a digital signal processor ("DSP"). Since DS1 protocol has a bit rate of 1.544 million bit per second ("Mbps") while conventional digital circuitry or microprocessors can operate at much higher clock frequencies, one processing engine, such as a digital circuit, a CPU, or a DSP, can be configured to emulate 193 parallel processing device whereby searches of all possible frame alignment can be simultaneously processed. It should be noted that parallel frame search on 193 bit positions, in some instances, can still miss frame alignment pattern(s).

Figure 4:
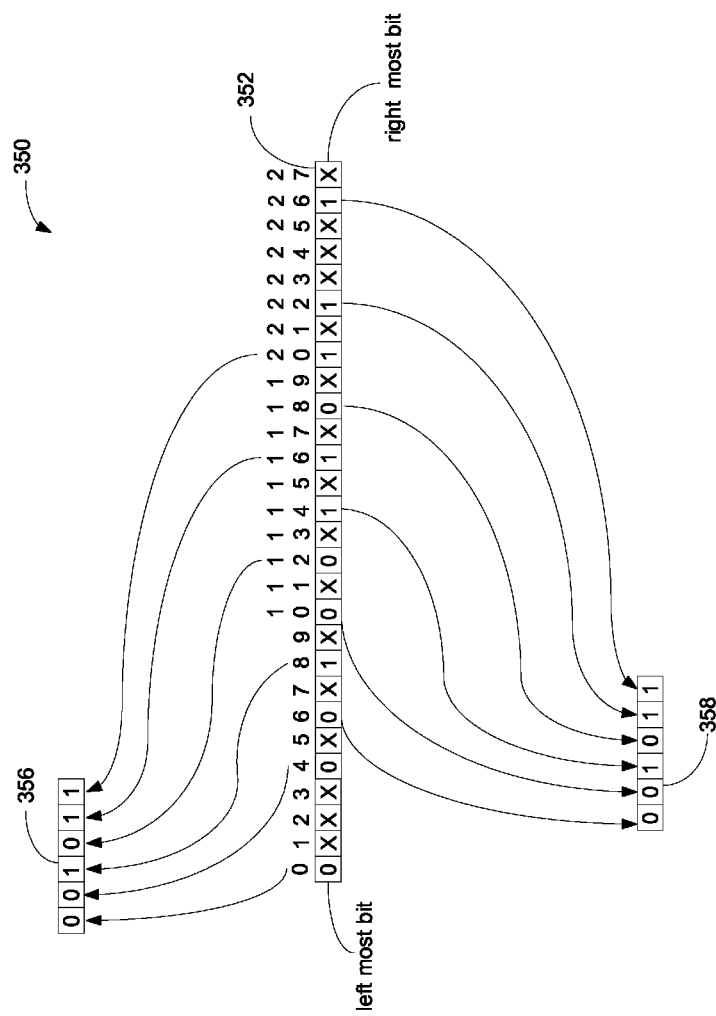
FIG. 4 is a block diagram illustrating an exemplary search process of frame pattern in accordance with one embodiment of the present invention.

FIG. 4 is a block diagram 350 illustrating an exemplary search process of frame pattern in accordance with one embodiment of the present invention. Diagram 350 includes a set of assumed F-bits 352, a first found pattern 356, and a second found pattern 358. In one example, at one bit position, the collected assumed F-bits stream is, "0XXX,0X0X,1X0X, 0X1X,1X0X, 1X1X,XX1X", where the leftmost bit is the first collected bit, and where "X" indicates arbitrary value.

During a search operation, a frame pattern of "001011" can be found at bit locations marked with 0, 4, 8, 12, 16, and 20. The found pattern, however, can be a false pattern and be eliminated later by the CRC check. Another frame pattern or second frame pattern of "001011" can also be found at bit positions marked with 6, 10, 14, 18, 22, and 26. Note that the second frame pattern may be a true frame pattern while the first frame pattern may be just a false pattern as in data bits. As can be seen, if the second and/or later pattern searches were not performed until a failure of CRC check on the assumed ESF determined by first pattern, possible correct frame pattern(s) such as the second frame pattern may be missed.

To enhance the speed of searching time, four (4) searching offsets for each bit position, in one embodiment, are maintained. For example, each searching offset looks every $4^{th}$ F-bits of the bit position. The offset 0, for instance, looks the F-bit locations marked with 0, 4, 8, 12, 16, and 20 and the offset 1 looks F-bit locations marked with 1, 5, 9, 13, 17, and 21. While the offset 2 looks F-bit locations marked with 2, 6, 10, 14, 18, and 22, the offset 3 looks F-bit locations marked with 3, 7, 11, 15, 19, and 23. With scheme of four (4) searching offsets, a total of 772 parallel searches are maintained because parallel searches of 193 bit positions multiplies 4 offsets per bit position equal to 772 parallel searches.

To emulate 772 parallel searches implemented by one searching processor, a global offset counter for all 193 bit positions is used. In addition, each bit position uses a quad frame counter. The offset counter and quad frame counter together indicate which frame within an ESF is being processed by a processor. For example, the $11^{th}$ frame will be counted as offset counter (ocnt) being 2 and quad counter (qcnt) being 1. Note that all counters counts from the value 0.

When searching for an ESF alignment, a processor iterates first on all the bit positions and then iterates on four (4) offsets. The processor finally iterates on quad counts. When the quad counter finishes counting from 0 to 5, one ESF's data are processed. The processor continues searching until a search yields a success result.

Figure 5A:
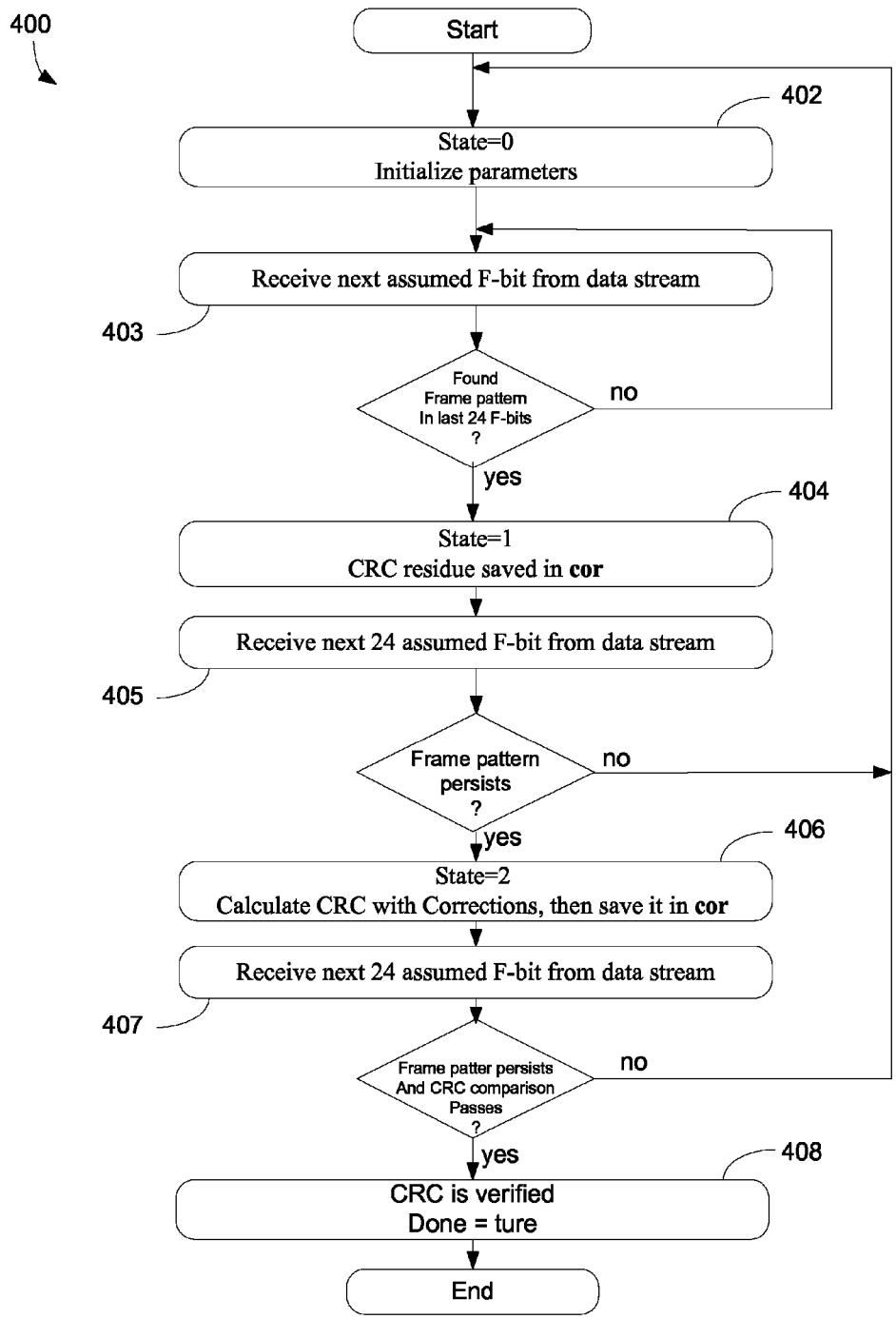

FIG. 5A is a flowchart 400 illustrating method one which is able to perform an ESF alignment using a global CRC calculation unit in accordance with one embodiment of the present invention. To simplify the description, flowchart 400 illustrates a process of alignment search for one (1) bit position. The process illustrated in flowchart 400 may be replicated 192 times to emulate parallel searches for 193 bit positions. At block 402, after setting the state to zero (state=0), the process initializes various parameters, such as shift registers, state counter, offset counters, et cetera. In one embodiment, the state changes when searching status changes. The state is 0 initially. When the process identifies a frame synchronization pattern from collected F-bits, the state is changed to 1, which indicates that the first pattern is found and the first assumed ESF boundary is set. It should be noted that at the end of the second ESF, the state is changed to 2, which indicates that a CRC is calculated and saved for this particular bit position. Finally, at the end of the third ESF, the saved CRC is compared with embedded CRC value (e-bits) extracted from the third ESF. If the CRC comparison is positively verified, the search process is complete. Otherwise the state is reset to 0 and the search continues.

At block 403, one assumed F-bit is received from the bit stream. Received F-bits are stored in a shift register. Up to 24 F-bits are stored. After receiving of each F-bit, the process checks if there is a frame alignment pattern in the 24 F-bits stored in the shift register.

At block 404, after a frame synchronizing bit pattern is found in the assumed F-bits, the state changes from state zero to state one (state=1). Search counters are also changed to align with the found assumed ESF boundary. The process, in one embodiment, saves or stores residue values upon finding of the assumed ESF boundary.

At block 405, a next block of 24 F-bits is received from a second assumed ESF. Now the shift register contains the 24 F-bits of the second ESF wherein F-bits are subsequently checked against the frame pattern. If the frame pattern persists in the second ESF, the search process continues at the next block. Otherwise, the search process is restarted at block 402.

At block 406, the process sets state to two (state=2) when the new F-bits are found to have persisting or the same frame pattern. A CRC value is subsequently calculated with the application of the global CRC calculation and CRC correction function. Correction function uses residue and F-bits to generate a corrected or adjusted CRC value with respect to the assumed ESF boundary.

At block 407, a next block of 24 F-bits is received from a third assumed ESF. When the shift register contains the new 24 F-bits of the third ESF, the F-bits are checked again with the frame patter. If the frame pattern persists in the third ESF, the search process proceeds to the next block. Otherwise the search process is restarted at block 402.

At block 408, the process confirms that the previously assumed ESF boundary is the true ESF alignment. The confirmation process involves in comparing the saved calculated CRC value with the embedded CRC value. Note that the embedded CRC value is extracted from the F-bits in the shift register. Upon successful checking the CRC value and verifying consistent bit pattern(s), the ESF alignment process is ended and the ESF boundary is found. Note that FIG. 5A shows flow diagram of the searching process of one bit position. Method one applies 193 parallel processes to search on 193 bit positions simultaneously, or implemented in 193 iterations at a faster processing speed. The first completion of one search among all these search processes terminates the frame alignment search and terminates all search processes.

In one embodiment, implementing DS1 alignment search requires a processing device and a memory device. The processing device can be a digital circuit, a CPU, or a DSP, wherein it is able to complete one (1) iteration of processing functions within one data bit cycle or clock cycle, namely one period of 1.544 MHz clock cycle which is approximately 647 nanoseconds ("ns"). The memory device, in one example, is able to store 13124 bits, and the operating speed of the memory device should be sufficient in talking or communicating with the processing device. The aspect radio (width and depth) of the memory device, in one embodiment, should be determined in accordance with the implementation practices of the processing device as well as availability of internal (of FPGA, for example) or external memories (of a CPU or DSP, for example).

In one aspect, the memory required to implement method one is approximately 13124 bits (or about 13K bits), which is divided into 193 records wherein each record contains 68 bits information. The 193 records are accessible by one or more processing devices independently or simultaneously. The following table describes the assignment of 68 bits.

| Used for | Field Name | Number of bits |
|---|---|---|
| Shift register, storing up to 24 assumed framing bits | sr[23:0] | 24 |
| searching state of offset 0 | state[0][1:0] | 2 |
| searching state of offset 1 | state[1][1:0] | 2 |
| searching state of offset 2 | state[2][1:0] | 2 |
| searching state of offset 3 | state[3][1:0] | 2 |
| Quad frame counter of offset 0 | qcnt[0][2:0] | 3 |
| Quad frame counter of offset 1 | qcnt[1][2:0] | 3 |
| Quad frame counter of offset 2 | qcnt[2][2:0] | 3 |
| Quad frame counter of offset 3 | qcnt[3][2:0] | 3 |
| CRC residue or result of offset 0 | cor[0][5:0] | 6 |
| CRC residue or result of offset 1 | cor[1][5:0] | 6 |
| CRC residue or result of offset 2 | cor[2][5:0] | 6 |
| CRC residue or result of offset 3 | cor[3][5:0] | 6 |
| Total | | 68 |

To prevent a block of searching by a false matching, parallel searches on four offsets are employed. Each offset searching process has its independent quad frame counter and searching state, as well as the CRC residue, saved in the memory.

For example, while offset 0 selects a first F-bit and then every $4^{th}$ F-bit from the first F-bit is selected, offset 1 selects a second F-bit next to the first F-bit and then every $4^{th}$ F-bit from the second F-bit. The offset 2 selects a third F-bit next to the second F-bit and then every $4^{th}$ F-bit from the third F-bit, and offset 3 selects a fourth F-bit next to the third F-bit and then every $4^{th}$ F-bit from the fourth F-bit. When performing a search, bits selected by all four offsets, in one embodiment, are searched for frame patterns independently. Note that it is possible that the frame pattern found in one offset can be a false match while a real match is located in another offset. Since the false pattern may appear earlier than the real pattern, the latter may be missed if only one offset is searched.

FIGS. 5B-D show an alignment pseudo code illustrating processes for method one in accordance with one embodiment of the present invention. FIG. 5B shows initialization code 410 and pattern search code 412. Initialization code 410, in one embodiment, initializes counters for counting incoming bit and limits such as counting up to 193 bit positions and 4 offsets. The variable "init" controls the initialization which happens at the first 772 data bits. Those bits are the first 4 frames of all four offsets. The variable "init" changes to 0 at the end of the $772^{nd}$ data bit. The parameters needed to be initialized include state ("state"), quad frame counters ("qcnt"). Code 410 also resumes values of number of registers from the memory, including shift register ("sr"), state ("state"), quad frame counter (qcnt), and CRC correction register ("cor"). Note that in certain condition value of some register(s) can be overwritten in the later code statements. For example, if it is in the initialization (init=1), the value of qcnt is overwritten by 0 in code 410. After the initialization, pattern search code 412 looks to match bit pattern 001011 with the F-bits saved in sr at bit indices of 20, 16, 12, 8, 4, and 0. If the bit pattern 001011 is found, pattern search code 412 stores the current global CRC calculator output as the residue value with respect to the assumed ESF boundary into register "cor". The state is subsequently changed to one (state=1).

In FIGS. 5B-D and FIGS. 6B-E, the operator "<=" indicates a register assignment statement. The value to right hand side of the operator "<=" is assigned to the register named at left hand side of the operator "<=". The operator "&&" indicates a logical AND operation between the values on both sides of the operator "&&". The operator "==" indicates an equal operation. If values on both sides are equal, the result is "true". The operator "⊕" indicates a logical exclusive OR operation.

FIG. 5C illustrates frame bit pattern persistent check code 450 and CRC calculation code 452. Code 450 checks if the frame synchronization pattern still persists at the end of the first assumed ESF. If it does, the code 452 is capable of calculating a CRC value with corrections that compensates the global CRC value with residues (saved in register "cor") and F-bits (saved in shift register "sr") in accordance with embodiments of the present invention. Upon verifying the frame synchronization bit pattern in code 450, CRC calculation code 452 generates a six-bit CRC value in accordance with the CRC calculation operation illustrated in FIG. 3B. It then changes the state to two (state=2).

FIG. 5D shows frame pattern persistent check and CRC check code 470, counting and shift register code 471, global CRC calculation and memory write code 472, and end of initialization code 474. When state=2, frame pattern persistent check and CRC check code 470 checks if the F-bits in the third ESF still have expected frame pattern. A comparison between six-bit CRC value fetched CRC result (saved in register "cor") with six e-bits extracted from the third ESF (stored in shift register "sr") is performed. Note that e-bits are situated at the F-bit indices 2, 6, 10, 14, 18, and 22. Once the CRC check passes, the process of searching ESF alignment is done. On the other hand, if the CRC check fails, the state is reset to zero (state=0) and the search on this bit position restarts. The code 471 increases counter values and updates the content of the shift register ("sr"). The code 472 calculates the global CRC value, and stores values of the registers back to the memory before continuing the search on the next bit position or offset. When bit counter ("bcnt") reaches 193 and offset counter ("ocnt") reaches 3 while in initialization state, code 474 ends the initialization state by setting variable "init" to 0.

Note that one iteration is defined as all operations in an inner loop, which includes memory read for 35 bits, memory write for 35 bits, and other various logical operations. Note that although one memory record has 68 bits, one iteration of operation only access 35 of them. In one embodiment, the above-mentioned operations complete by a processing device within one bit cycle (approximately 647 ns). The following table illustrates exemplary allocations of cache registers used in the pseudo code. These registers are used to hold values retrieved from memory and to hold changed values during one iteration. Some registers, such as crc[5:0] and ocnt[1:0], are globally used and do not need to store into memory.

| Register Name | Description | Number of Bits |
|---|---|---|
| done | Alignment search complete indicator | 1 |
| init | Initial flag, asserted during first 193 bits | 1 |
| ocnt[1:0] | Offset count | 2 |
| crc[5:0] | CRC calculation register | 6 |
| bcnt[7:0] | Bit position count | 8 |
| sr[23:0] | Register to hold read value from memory, fbit shift bits | 24 |
| state[1:0] | Register to hold read value from memory, state bits | 2 |
| cor[5:0] | Register to hold read value from memory, CRC correction | 6 |
| qcnt[2:0] | Register to hold read value from memory, quad frame count | 3 |

The best case scenario of method one for DS1 alignment search lasts about three (3) ESF durations. With this scenario, the search process begins at the beginning of an ESF and the frame pattern is found in the first ESF. At the end of the first ESF duration, the state is set to one (1) and the residue is saved. At the end of the second ESF duration, the global CRC value is corrected by the saved residue and the framing bits saved in sr. The result is subsequently saved in the memory. At the end of the third ESF duration, the CRC bits embedded within the framing bits in the sr register are compared with the CRC result saved in memory. If the embedded CRC bits matches with the CRC result, the alignment search is completed and variable done is set to one (1). As such, the total number of search duration is three ESF durations which are approximately equivalent to 9 ms.

The worst case scenario of method one, however, can happen when search of alignment occurs just after the first frame synchronization bit of the first ESF. The frame pattern may not be found until the second ESF. The remaining searching and verifying processing steps are substantially similar as discussed earlier. Since the worst case scenario requires two (2) ESFs to discover a first pattern match, the total number of alignment search requires four (4) ESF durations which are approximately 12 ms. As such, an average searching time of method one is approximately 10.5 ms.

Figure 6A:
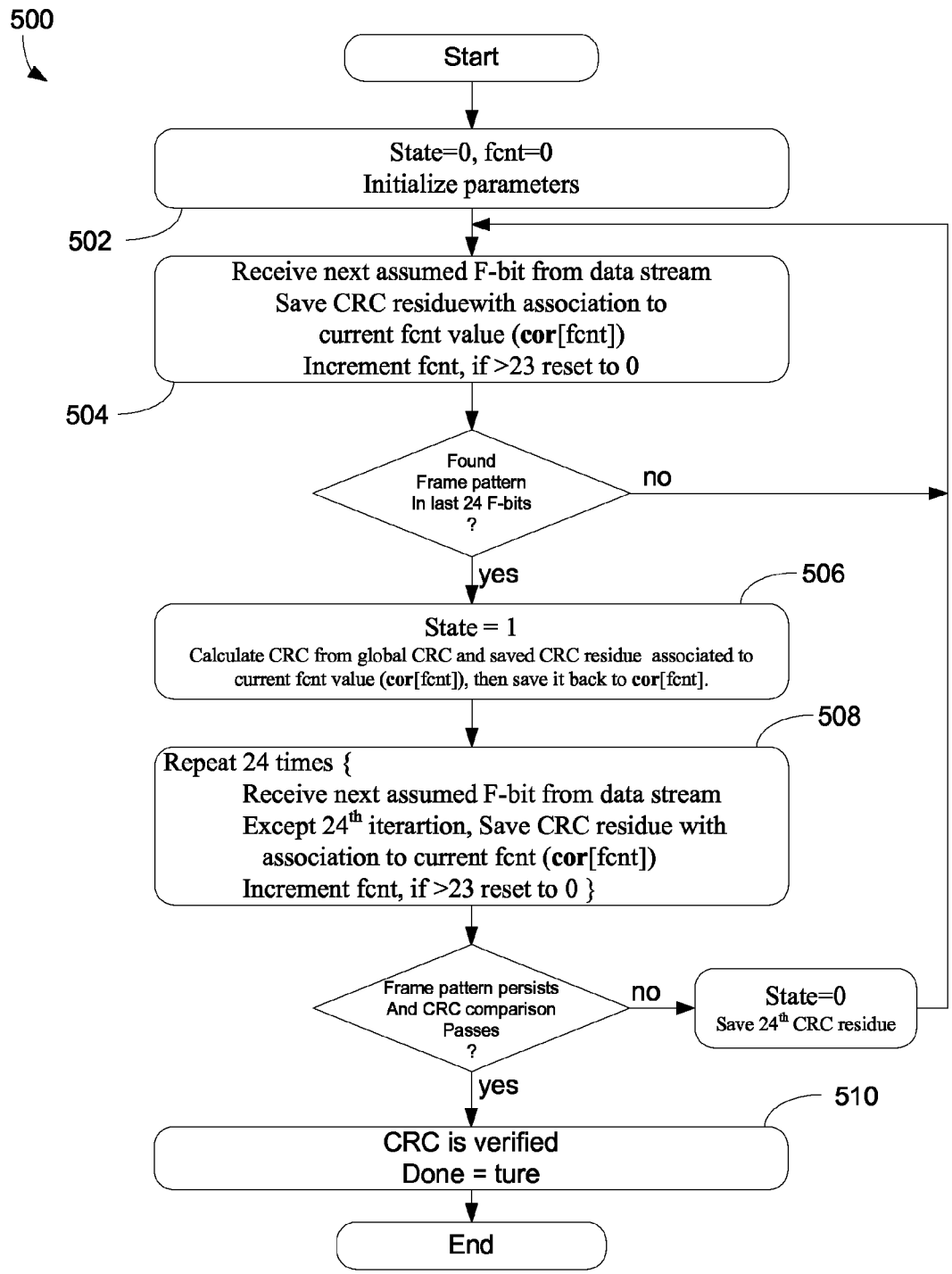

FIG. 6A is a flowchart 500 illustrating method two capable of identifying an ESF alignment with false alignment protection in accordance with one embodiment of the present invention. To simplify the description, flowchart 500 illustrates a process of alignment search for one (1) bit position. The process illustrated in flowchart 500 may be replicated 192 times to emulate parallel searches for 193 bit positions. Method two, in one embodiment, is capable of identifying an ESF alignment faster than method one since method two uses more storage capacity. For example, the best case scenario for method two to identifying a DS1 alignment is about two (2) ESF durations while the worst case scenario for method two is approximately three (3) ESF durations.

Method two, in one embodiment, saves 24 residue values for all ESF alignment positions thereby a CRC result becomes available as soon as a match of frame pattern is found. For the best case scenario, a frame pattern is found at the end of the first ESF, and at the same time, a corrected CRC result can also be generated using the residue saved at the time one ESF ago. During the second ESF, the CRC check is performed. As such, method two can determine an ESF alignment or boundary within two ESF durations or 6 ms.

During a worst case scenario, one additional ESF duration is needed when the alignment process begins just after the first frame synchronization bit. As such, the time required during a worst case scenario for method two is roughly three (3) ESF durations, or 9 ms. Accordingly, the average searching time for method two is 7.5 ms.

Referring back to FIG. 6A, at block 502, when in initialization state, the state is set to zero (state=0), the frame count ("fcnt") is also initialized to 0. The process of ESF alignment initializes parameters and prepares for bit pattern searching. At block 504, one assumed F-bit is received and is pushed into a shift register. At block 506, if a predefined frame pattern such as 001011 is found in 24 F-bits stored in the shift register, the process set the state to one (state=1). Upon identifying a frame pattern, an assumed ESF boundary is determined. The process is able to produce a CRC value using a saved residue value (in cor[fcnt]) for adjusting the final output of CRC calculation unit in block 506. This CRC result is then stored back into memory (same field as marked by cor[fcnt]). At block 508, the next 24 F-bits are received during the second ESF. With comparison of the saved CRC result (in cor[fcnt]) and the embedded CRC (e-bits) found in the shift register (sr) at the end of the second ESF, the assumed ESF boundary is verified as a true ESF alignment when the CRC check passes.

When done parameter "done" is set to one, it indicates that the alignment searching is done. Note that FIG. 6A shows flow diagram of the searching process of one frame alignment bit position. Method two applies 193 parallel processes to search on 193 bit positions simultaneously, or implemented in 193 iterations at a faster processing speed by a single process unit. The first completion of one search among all these search processes terminates the frame alignment search and terminates all search processes.

Method two, in one embodiment, requires a memory capacity of 35512 bits (about 35K bits) organized in 193 records wherein each record contains 184 bits of information. The following table lists the assignment of one record in memory used by method two for identifying an ESF boundary.

| Used for | Field Name | Number of bits |
|---|---|---|
| Shift register, storing up to 24 assumed framing bits | sr[23:0] | 24 |
| searching state for offset 0 | state[0] | 1 |
| searching state for offset 1 | state[1] | 1 |
| searching state for offset 2 | state[2] | 1 |
| searching state for offset 3 | state[3] | 1 |
| Quad frame counter for offset 0 | qcnt[0][2:0] | 3 |
| Quad frame counter for offset 1 | qcnt[1][2:0] | 3 |
| Quad frame counter for offset 2 | qcnt[2][2:0] | 3 |
| Quad frame counter for offset 3 | qcnt[3][2:0] | 3 |
| CRC residue or result | cor[0][5:0] | 6 |
| CRC residue or result | cor[1][5:0] | 6 |
| CRC residue or result | cor[2][5:0] | 6 |
| CRC residue or result | cor[3][5:0] | 6 |
| CRC residue or result | cor[4][5:0] | 6 |
| CRC residue or result | cor[5][5:0] | 6 |
| CRC residue or result | cor[6][5:0] | 6 |
| CRC residue or result | cor[7][5:0] | 6 |
| CRC residue or result | cor[8][5:0] | 6 |
| CRC residue or result | cor[9][5:0] | 6 |
| CRC residue or result | cor[10][5:0] | 6 |
| CRC residue or result | cor[11][5:0] | 6 |
| CRC residue or result | cor[12][5:0] | 6 |
| CRC residue or result | cor[13][5:0] | 6 |
| CRC residue or result | cor[14][5:0] | 6 |
| CRC residue or result | cor[15][5:0] | 6 |
| CRC residue or result | cor[16][5:0] | 6 |
| CRC residue or result | cor[17][5:0] | 6 |
| CRC residue or result | cor[18][5:0] | 6 |
| CRC residue or result | cor[19][5:0] | 6 |
| CRC residue or result | cor[20][5:0] | 6 |
| CRC residue or result | cor[21][5:0] | 6 |
| CRC residue or result | cor[22][5:0] | 6 |
| CRC residue or result | cor[23][5:0] | 6 |
| Total | | 184 |

FIGS. 6B-E show a pseudo code illustrating processes for implementing method two of ESF alignment using a single CRC calculator in accordance with one embodiment of the present invention. FIG. 6B shows initialization code 520 capable of initializing quad frame counters (qcnt) and states (state) of all 193 bit positions. Code 520 also retrieves values of number of registers from the memory, including shift register ("sr"), state ("state"), quad frame counter ("qcnt") and CRC correction register ("cor"). Note that in certain conditions, values of some register(s) can be overwritten in a later code statement. For example, if it is in the initialization state (init=1), the value of qcnt is overwritten by 0 in code 520.

FIG. 6C shows pattern search code 550 and CRC calculation code 552. After initialization, pattern search code 550 searches bit pattern 001011 in the 24 F-bits stored in the shift register ("sr"). Upon matching the bit pattern, CRC calculation code 552 generates a six-bit CRC value in accordance with the CRC calculation illustrated in FIG. 3B. Global calculated CRC value, CRC residue saved at code 570, and 24 F-bits in the shift register are used in calculating correct CRC value.

FIG. 6D shows frame pattern persistent check and CRC check code 560 and restart search code 562. When state is one (state=1), code 560 first checks if the frame synchronization pattern is still correct in the second ESF. It then compares the six-bit pre-calculated CRC value from register cor[5:0] with six e-bits extracted from the shift register ("sr"), which contains the 24 F-bits of the second ESF. Once the CRC value is checked and passed, the search process for ESF alignment is concluded. The last line in FIG. 6D increments the quad frame counter ("qcnt").

FIG. 6E shows residue capture code 570, shift register updating and global CRC calculation code 571, memory write code 572, and counter increment and end of initialization code 574. Before the synchronization bit pattern is found, CRC residues are captured from global CRC calculation values and stored in the memory. The residue values will be used later whenever the bit pattern is found. Code 571 shifts the data in the shift register and calculates the global CRC value. Code 572 saves the updated values in registers back to the memory. Code 574 increments the frame counter ("fcnt"). When bit counter ("bcnt") reaches 192 and the offset counter ("ocnt") reaches 3, the initialization state is turned off (init=0).

Method two, in one embodiment, requires more memory capacity to operate than method one. In one instance, method two may use approximately three (3) times memory as much as method one. Depending on the applications, method two offers faster frame alignment but it requires more resources than method one. It should be noted that the embodiments of the present invention are applicable to other similar serial communication protocols.

Note that one (1) iteration is defined as all operations in an inner loop, which includes memory read for 34 bits, memory write for 34 bits, and other various logical operations. Note that although one memory record has 184 bits, one iteration of operations only access 34 of them. In one embodiment, the above-mentioned operations are completed by a processing device within one bit cycle (approximately 647 ns). The following table illustrates exemplary allocations of cache registers used in the pseudo code. These registers are used to hold values retrievable from a memory and to hold changed values during one (1) iteration. Some registers, such as crc[5:0], fcnt, bcnt, and ocnt[1:0], are globally used and do not need to store in the memory.

| Register Name | Description | Number of Bits |
|---|---|---|
| done | Alignment search complete indicator | 1 |
| init | Initial flag, asserted during first 193 bits | 1 |
| ocnt[1:0] | Offset count | 2 |
| crc[5:0] | Global CRC calculation register | 6 |
| bcnt[7:0] | Bit position count | 8 |
| fcnt[4:0] | Frame count, reset to 0 when counting to 24 | 5 |
| sr[23:0] | Register to hold read value from memory, fbit shift bits | 24 |
| state[1:0] | Register to hold read value from memory, state bits | 2 |
| cor[5:0] | Register to hold read value from memory, CRC correction | 6 |
| qcnt[2:0] | Register to hold read value from memory, quad frame count | 3 |

Note that the processes illustrated in FIG. 5 and FIG. 6 do not change if the value saved in the memory is any variation derived from original values. For example, instead of storing residue values into the memory, one can derive correction terms and store them into the memory. These terms can then be used to correct CRC at a later time. Similar procedures can be used for computing residues.

Figure 7:
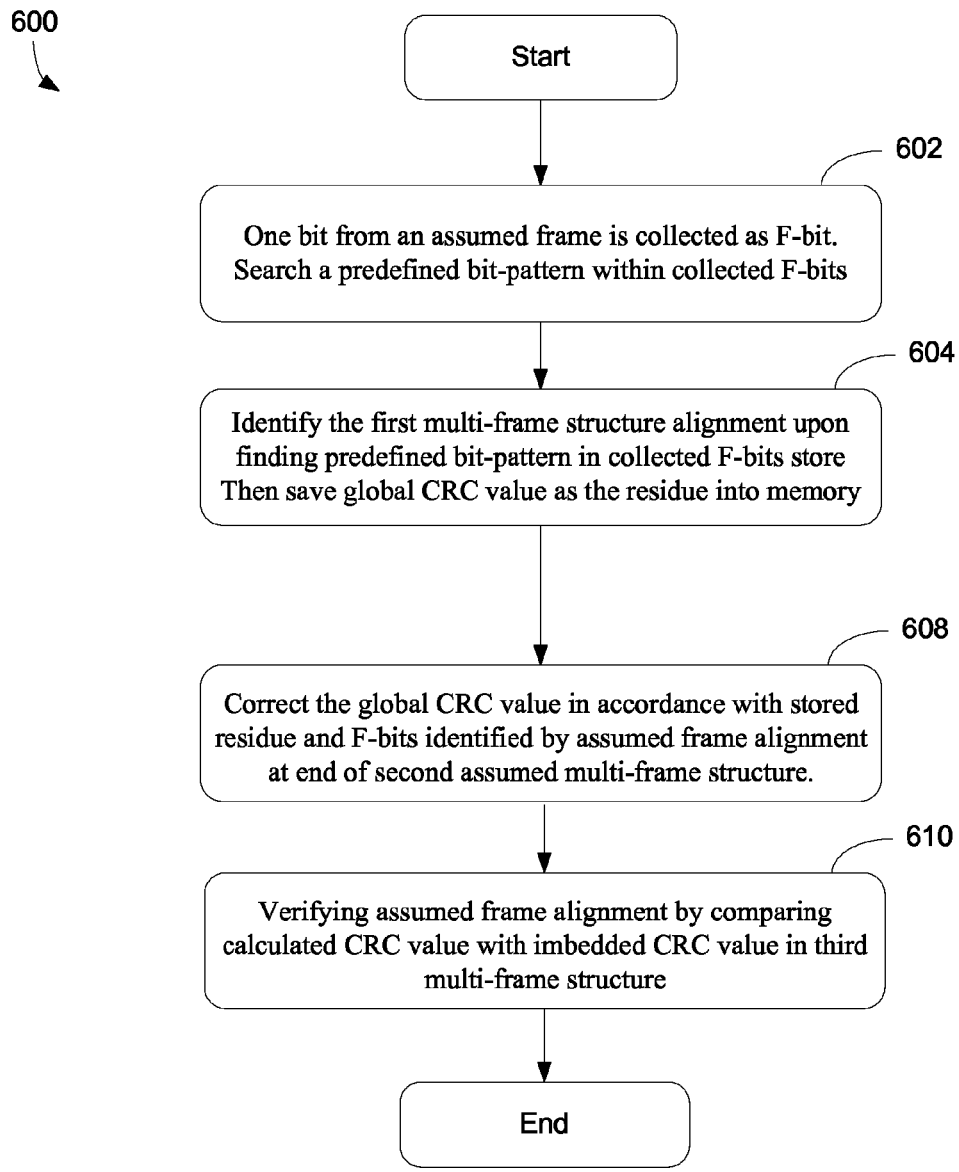
FIG. 7 is a flowchart illustrating an alignment operation (of method one) using CRC corrections in accordance with one embodiment of the present invention.

FIG. 7 is a flowchart 600 illustrating a frame alignment operation (method one) using CRC values in accordance with one embodiment of the present invention. At block 602, a process of frame alignment begins to search a predefined bit pattern such as 001011 in collected assumed F-bits. A multi-frame structure contains N frames. Multi-frame structure, in one embodiment, is a DS1 or T1 ESF and has N=24 frames. The process composes frame bits, also known as F-bits, by extracting one (1) bit from each frame. After determining a set of, for example, 6 bits of frame alignment signal from the collected F-bits, the process compares the predefined bit pattern with the frame alignment signal. Upon a match between the predefined bit pattern and a set of collected F-bits is found, the first assumed multi-frame structure is identified. In one embodiment, upon receiving a data stream organized in a format of multi frame structure, the process is capable of storing the data stream in a storage location.

At block 604, the process identifies an assumed multi-frame structure boundary upon finding the predefined bit pattern in the collected F-bits. For example, the process provides a first assumed ESF boundary when frame alignment signal of 001011 is identified in F-bits. It then takes the global CRC calculation value as the CRC residue used for the current identified multi-frame structure.

At block 608, the process calculates a CRC result in response to the assumed frame alignment. Based on the global CRC calculation value at the end of the second assumed multi frame structure, the process uses saved CRC residue, and extracted F-bits from the second assumed multi-frame structure, to compute a new CRC result. The process, in one embodiment, is able to derive the CRC result without resetting the CRC registers before each calculation, and without forcing F-bits to logic one.

At block 610, the process verifies the assumed frame boundary by comparing the calculated CRC value mentioned above with the CRC value embedded in the third multi-frame structure. To verify the assumed frame boundary, the process extracts, for example, six (6) CRC bits from F-bits of a third ESF. The process also checks the consistent of bit pattern in the second and third multi frame structures. It should be noted that flowchart 600 illustrated in FIG. 7 primarily focuses a frame alignment search process of one frame alignment bit position. The method one of the present invention, however, can be applied multiple times for multiple bit positions. Note that implementation of parallel devices or one device with fast speed can be used.

Figure 8:
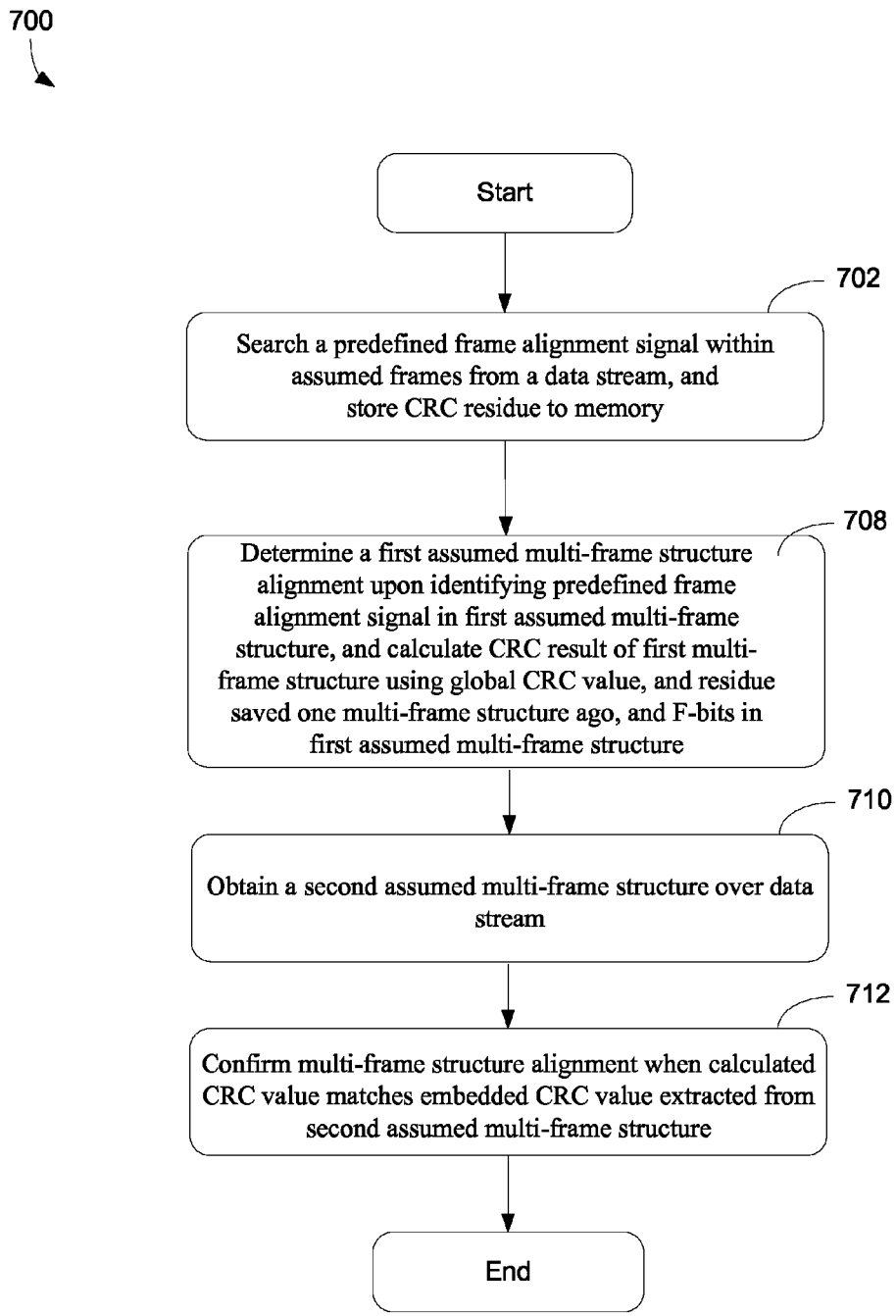
FIG. 8 is a flowchart illustrating alternative alignment operation (of method two) using CRC corrections or adjustments in accordance with one embodiment of the present invention.

FIG. 8 is a flowchart 700 illustrating alternative alignment operation (method two) using CRC values in accordance with one embodiment of the present invention. At block 702, the process obtains assumed frames over a data stream. One frame bit or F-bit from each frame is extracted. The process searches a predefined frame alignment signal in these F-bits. When it finds such an alignment signal pattern, the first multi-frame structure of N frames is assumed. Multi-frame structure, in one embodiment, is a DS1 or T1 ESF and has N=24 frames. For example, the process searches a predefined bit pattern such as 001011 in the frame alignment signal of the 24 F-bits. While searching frame alignment signal, the process also stores global CRC calculation value as the CRC residue of each assumed frame.

At bock 708, the process determines a first assumed multi-frame structure boundary upon identifying the predefined frame alignment signal in the collected F-bits. It should be noted that the match of frame alignment signal can be a false pattern. In addition, the CRC result of the first assumed multi-frame structure can be obtained by correcting a global CRC value with stored CRC residue and the F-bits of the first assumed ESF.

At block 710, the process obtains a second assumed multi-frame structure over the data stream. Each multi-frame structure, for example, may contain 4632 bits.

At block 712, the process confirms the multi-frame structure alignment when the calculated CRC value (in block 708) matches with the embedded CRC value extracted from F-bits of the second assumed multi-frame structure. For example, upon extracting six (6) of the F-bits in the second multi-frame structure, the process confirms the multi-frame structure alignment when the calculated CRC value matches with these six (6) bits.

While particular embodiments of the present invention have been shown and described, it will be obvious to those skilled in the art that, based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method for frame alignment, comprising:
   obtaining assumed frames over a data stream with one bit position;
   extracting one frame bit ("F-bit") from each frame;
   searching a predefined frame alignment signal over the F-bits;
   identifying a first assumed extended super frame ("ESF") when the predefined frame alignment signal is identified;
   storing cyclic redundancy check ("CRC") residue generated from a global CRC calculator when the first assumed ESF is identified;
   obtaining a second assumed ESF over the data stream;
   calculating a CRC value in accordance with a global CRC value and the CRC residue and associated F-bits with the second assumed ESF to adjust the global CRC value;
   obtaining a third assumed ESF over the data stream; and
   confirming a first ESF alignment when the CRC value matches with embedded CRC value extracted from the third assumed ESF.

2. The method of claim 1, wherein obtaining a first assumed ESF includes:
   identifying 24 frames in the first ESF; and
   composing 24 F-bits by extracting one (1) bit from each frame.

3. The method of claim 1, wherein searching a predefined frame alignment signal within the first assumed ESF includes identifying a predefined bit pattern in frame alignment signal of 24 F-bits.

4. The method of claim 3, wherein calculating a CRC value in accordance with a global CRC calculation includes utilizing the residues to correct CRC values in CRC registers.

5. The method of claim 4, wherein calculating a CRC value includes utilizing a set of predefined number of F-bits to adjust the first CRC value for compensating CRC result.

6. The method of claim 1, wherein confirming a first ESF alignment includes,
   extracting six (6) check bits from F-bits of a second ESF; and
   confirming an ESF alignment when the calculated CRC value matches with the six (6) check bits.

7. A network device comprising:
   a memory capable of being arranged its storage space into multiple storage sections for storing information from a data stream having a data format of multi-frame structure and a section of operation variables;
   a processing device coupled to the memory and configured to identify a frame alignment relating to the data stream, wherein the processing device includes,
   a pattern search module capable of identifying frame alignment signals in accordance with a predefined bit pattern; and
   a cyclic redundancy check ("CRC") module operable to generate a CRC value in response to a portion of residue values generated during previous assumed extended super frame ("ESF") and a global CRC value generated based on an assumed alignment boundary.

8. The device of claim 7, wherein each storage section is capable of storing 24 digital signal 1 ("DS1") frames wherein each frame is logically organized in a single column.

9. The device of claim 8, wherein the processing device includes one of central processing unit ("CPU"), digital processor, digital controller, digital signal processor ("DSP"), and a programmable processing circuit.

10. The device of claim 9, wherein the CRC module is further capable of calculating the CRC value in response to a portion of F-bits.

11. The device of claim 10, wherein the CRC module is further configured to compute a CRC value for every DS1 extended super frame ("ESF") received from the data stream.

12. A method for identifying a frame boundary, comprising:
   obtaining assumed frames over a data stream based on a bit position;
   extracting one frame bit ("F-bit") from each assumed frame;
   saving cyclic redundancy check ("CRC") residue in accordance with the assumed frames;
   searching a predefined frame alignment signal over the F-bits;
   identifying a first assumed extended super frame ("ESF") when the predefined frame alignment signal is identified;
   obtaining a second assumed ESF over the data stream based on the first assumed ESF;
   calculating a CRC value in response to a global CRC value, the CRC residue and associated F-bits with the second assumed ESF to adjust the global CRC value; and
   confirming an ESF alignment when the CRC value matches with embedded CRC value extracted from the second assumed ESF.

13. The method of claim 12, wherein obtaining a first assumed ESF further includes,
   identifying 24 frames in the first ESF; and
   composing 24 F-bits by extracting one (1) bit from each frame.

14. The method of claim 12, wherein searching a predefined frame alignment signal further includes identifying a predefined bit pattern in frame alignment signal of 24 F-bits.

15. The method of claim 12, further comprising saving CRC residue in accordance with the second assumed ESF.

16. The method of claim 12, wherein calculating a CRC value includes utilizing a set of predefined number of F-bits to adjust the first CRC value for compensating CRC result.

17. The method of claim 12, wherein confirming a first ESF alignment includes,
  extracting six (6) check bits from F-bits of a second ESF; and
  confirming an ESF alignment when the calculated CRC value matches with the six (6) check bits.

\* \* \* \* \*